United States Patent
Maxey, Jr. et al.

[11] Patent Number: 5,150,385
[45] Date of Patent: Sep. 22, 1992

[54] SYNCHRONIZED PULSED LOOK-AHEAD CIRCUIT AND METHOD

[75] Inventors: Jay A. Maxey, Jr.; Kevin M. Ovens, both of Garland, Tex.

[73] Assignee: Texas Instruments Incorporated, Dallas, Tex.

[21] Appl. No.: 637,837

[22] Filed: Dec. 28, 1990

[51] Int. Cl.$^5$ .............................................. H03K 5/05
[52] U.S. Cl. ................................. 375/106; 307/267; 307/268; 328/185
[58] Field of Search ............... 307/480, 260, 267, 268, 307/269, 265, 272.1, 601; 328/164, 185; 375/104, 106; 455/223

[56] References Cited
U.S. PATENT DOCUMENTS

| | | | |
|---|---|---|---|
| 4,051,390 | 9/1977 | Reeves | 307/265 |
| 4,176,625 | 12/1979 | Stauffer | 307/267 |
| 4,498,021 | 2/1985 | Uya | 307/268 |

Primary Examiner—Benedict V. Safourek
Attorney, Agent, or Firm—B. Peter Barndt; Richard L. Donaldson

[57] ABSTRACT

A synchronized pulsed look-ahead circuit (10 in FIG. 1) effects look-ahead operations for a flip-flop (20). It includes a LAPP section (12) and a DATA sense and control section (14). To initiate a look-ahead operation, the LAPP section triggers in synchronism with the control edge of CLK, swtiching the LAPP line active and enabling the DATA sense and control section. While enabled, the DATA sense and control section receives DATA IN, and depending on its phase, provides the appropriate logic levels to the DATA output driver, which then provides the appropriate DATA OUT. When the flip-flop has latched the DATA and is ready to assume control of the DATA OUT line, i.e., after the associated propagation delay, the LAPP pulse is terminated and the DATA sense and control section is disabled, terminating the look-ahead operation.

21 Claims, 1 Drawing Sheet

SYNCHRONIZED PULSED LOOK-AHEAD CIRCUIT AND METHOD

TECHNICAL FIELD OF THE INVENTION

The invention relates generally to integrated circuit devices, and more particularly relates to a pulsed look-ahead circuit and method for synchronized devices that effects look-ahead operations in synchronism with the control/clock for the device. In even greater particularity, the pulsed look-ahead circuit and method effects both HI and LO look-ahead operations in conjunction with storage devices (such as flip-flops), bypassing the device to assume control of the data output during a look-ahead period synchronized to the controlling clock, and then deactivating when the device establishes control (i.e., after the associated propagation delay).

BACKGROUND OF THE INVENTION

Storage devices, such as flip-flops and registers, introduce gate delays between the time data is known and the time that the data is latched and then propagated to the output driver. Look-ahead circuits are often employed to reduce this propagation delay, thereby enhancing the speed of the data output operation.

The specific problem to which the invention is applicable is an improved look-ahead technique for reducing the delays associated with storage devices, while still guaranteeing the required synchronism with the controlling clock pulses. Ideally, such an improved look-ahead technique could be used in both the HI and LO phases of the storage operation.

The look-ahead concept is generally applicable to synchronized devices where a result or output is known prior to the associated control or clocking event that synchronizes the device. For flip-flops, the typical approach takes advantage of their two stage, master/slave configuration in which data is first latched into a master section, and then propagated to the slave section and thence to an output driver for the DATA line. This storage operation involves three gate delays—the internal clock, the master section and the slave section—which in current technology translates typically into about 6 ns (nanoseconds), although 4 ns devices are available.

Look-ahead operations are performed by using the logic levels of the master section to generate an output value, thereby bypassing the slave section and the associated propagation delay. By using the device itself for look-ahead operations, synchronism is maintained with the controlling clock.

However, this look-ahead technique can only be used for the one phase of the storage operation. Specifically, when the associated output transistor is on, the low-going edge that latches the master can also be used to switch the output transistor off—this is a LO phase look-ahead technique that cannot be used when the output transistor is off because adding an inverter to use the low-going edge in the master to switch the output transistor on (HI phase) would introduce a gate delay that would cancel the time saved by looking ahead of the slave section.

Moreover, even for LO phase look-ahead, the flip-flop is not completely bypassed, but rather, only the gate delay associated with the slave section is avoided. The gate delays associated with the internal clock and the master section are still present.

Thus, using current look-ahead techniques, 6 ns devices can operate in the range of 4 or 5 ns for the LO phase.

Accordingly, a need exists for an improved look-ahead technique for synchronized devices, such as storage devices, that bypasses the device while maintaining synchronism with the control/clock.

SUMMARY OF THE INVENTION

The invention is a synchronized pulsed look-ahead circuit and method for a synchronized device (such as a flip-flop), that effects synchronized pulsed look-ahead operations to control device output during predetermined look-ahead periods that are sufficiently long to accommodate device propagation delays, after which look-ahead control is disenabled. This look-ahead technique bypasses the device while maintaining synchronism with control/clock signals, thereby bypassing propagation delays and enabling look-ahead operations in both HI and LO phases.

In one aspect of the invention, the synchronized pulsed look-ahead circuit includes a LAPP (look-ahead power pulse) section and a DATA sense and control section. The LAPP section generates synchronized LAPP pulses each of which becomes active in synchronism with the CONTROL signal, and is then switched inactive after a look-ahead period of a predetermined hold time Th. The DATA sense and control section is enabled by the LAPP pulses, and is responsive to at least one phase of the DATA input for independently controlling, during the associated look-ahead periods, the DATA output of the synchronized device.

In response to a LAPP pulse, the corresponding DATA output phase is provided after a predetermined set-up time Tsu which is less than the associated propagation delay for the synchronized device. The duration of the hold time Th of the LAPP pulse is at least as long as the propagation delay such that at the end of the LAPP pulse the synchronized device has established control over the DATA output.

Thus, one aspect of the synchronized pulsed look-ahead method involves: (a) generating a synchronized LAPP (look-ahead power pulse) pulse that becomes active in synchronism with a CONTROL signal, and is then switched inactive after a predetermined look-ahead period; (b) independently controlling the DATA output of the device during selected look-ahead periods; and (c) returning control of the DATA output to the device at the end of the look-ahead period, after the associated propagation delay.

In more specific aspects of the invention, the synchronized pulsed look-ahead circuit is used to perform look-ahead operations for both HI and LO DATA input/output phases of flip-flops and other synchronized storage devices.

The LAPP section comprises a LAPP output transistor and a one-shot timer. The LAPP output transistor is switched on by a falling edge of the internal flip-flop clock, which initiates a LAPP pulse, and then switched off by the one-shot timer after the predetermined duration Th of the look-ahead period, which terminates the LAPP pulse.

The DATA sense and control section comprises a HI-phase output control transistor and a LO-phase output control transistor, each with a set-up bias network. Each output control transistor is responsive to a LAPP pulse and a DATA input of the respective phase to provide an output control signal that controls the flip-flop output to provide the associated HI/LO DATA output. The set-up bias network is used to establish the set-up time Tsu for providing the output control signal after the initiation of the LAPP pulse.

The technical advantages of the invention include the following. The synchronized pulsed look-ahead technique can be used to effectively bypass the propagation delays associated with a synchronized device. Look-ahead operations are effected by LAPP pulses synchronized with the internal control/clock. Independent control is possible for both the hold time Th (the duration of the LAPP pulse) and the set-up time Tsu (the time between the initiating a LAPP pulse and achieving DATA output control), thereby allowing these parameters to be cooperatively selected in accordance with a desired metastability performance for the synchronized device. In the context of storage devices, the pulsed look-ahead circuit is able to sense both HI and LO phases of the DATA, and provide an appropriate control signal to the output driver for the storage device (while enabled by a LAPP pulse). As a collateral advantage, the power consumption in a synchronized device that is attributable to reducing propagation delays can be significantly reduced.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of an exemplary embodiment of the synchronized pulsed look-ahead circuit and method is organized as follows:
1. Synchronized Pulsed Look-Ahead Technique
2. Synchronized Pulsed Look-Ahead Circuit
   2.1. LAPP Section
   2.2. DATA Sense and Control Section
   2.3. Optimizing Set-Up and Hold Times
3. Conclusion The exemplary embodiment is described in relation to implementing synchronized pulsed look-ahead operations for flip-flops. However, the invention has general applicability to storage devices (such as registers and latches in addition to flip-flops) and other synchronized devices that operate in synchronism with a control/clock such that DATA output is based upon a known input and the control/clock, resulting in propagation delays in providing the DATA output. Examples of other look-ahead applications would be A/B select components, and enable/disable bus drivers.

Figure 1:
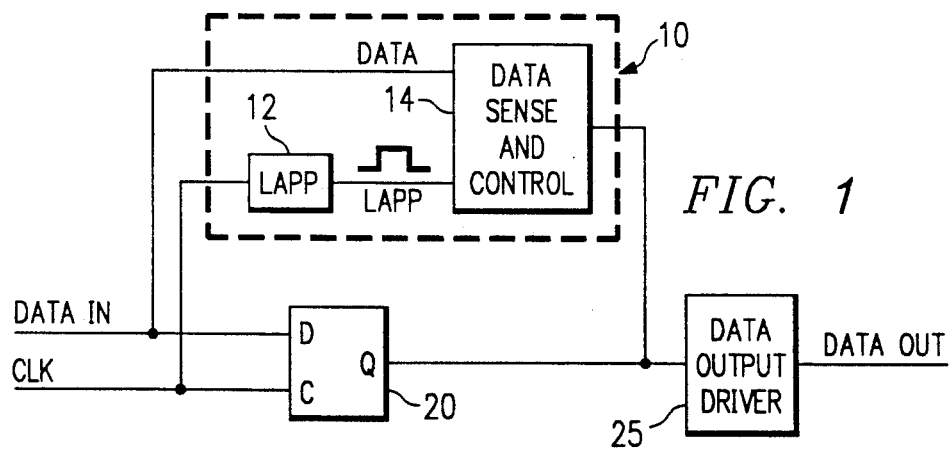
FIG. 1 is a functional block diagram of the synchronized pulsed look-ahead technique of the invention.

1. Synchronized Pulsed Look-Ahead Technique. FIG. 1 functionally illustrates the synchronized pulsed look-ahead technique of the invention. A synchronized pulsed look-ahead circuit 10 effects look-ahead operations for a flip-flop 20.

Flip-flop 20 receives DATA IN and CLK inputs, latches the DATA input in synchronism with the CLK, and provides the appropriate HI/LO phase output to control a DATA output driver 25, which in turn controls the DATA OUT line.

In normal operation, flip-flop 20 introduces about a 6 ns (nanosecond) propagation delay between DATA IN and DATA OUT. That is, the propagation delay occurs between the time that DATA IN and a synchronizing CLK signal appear at the input of the flip-flop and the time that the DATA is latched and propagated to the DATA output driver that correspondingly controls the DATA OUT line.

The synchronized pulsed look-ahead technique can be used to bypass the normal propagation delay of the flip-flop, reducing the total DATA output delay to about 2 ns. The synchronized pulsed look-ahead circuit 10 receives DATA IN and CLK, and effectively bypasses the flip-flop to independently control its DATA output driver, and thereby control the DATA OUT line.

The exemplary synchronized pulsed look-ahead technique involves: (a) generating, in synchronism with CLK, a LAPP pulse to enable a look-ahead operation; (b) sensing the HI/LO phase of DATA IN and independently controlling the DATA output driver 25 to provide the appropriate DATA OUT; and (c) at the end of the LAPP pulse, disenabling the look-ahead operation and returning control of the DATA output driver to the flip-flop 20 which has completed latching DATA IN.

Synchronized pulsed look-ahead circuit 10 includes a LAPP (look-ahead power pulse) section 12 and a DATA sense and control section 14. The CLK and DATA IN inputs to the flip-flop 20 are also input respectively to the LAPP section 12 and the DATA sense and control section 14.

To initiate a look-ahead operation, LAPP section 12 triggers in synchronism with the control edge of CLK, switching the LAPP line active and enabling the DATA sense and control section 14. While enabled, the DATA sense and control section receives DATA IN, and senses its phase. Depending on the phase of DATA IN, the DATA sense and control section provides the appropriate logic levels to the DATA output driver 25, which then provides the appropriate DATA OUT.

Meanwhile, after a propagation delay, flip-flop 20 completes latching the DATA, and is ready to control the DATA output driver and the DATA OUT line.

After a predetermined look-ahead period, LAPP section 12 switches the LAPP line inactive, terminating the LAPP pulse. As a result, the DATA sense and control section 14 is disenabled, and control over the DATA output driver 25 reverts to flip-flop 20.

The LAPP section is configured so that the look-ahead period of the LAPP pulse is at least as long as the expected propagation delay associated with the flip-flop, but not significantly longer. Thus, the LAPP section provides a look-ahead window around each CLK pulse that is opened to permit DATA IN to be transferred to the DATA OUT line before the flip-flop completes its latching operation, but then is closed to prevent other DATA transitions from being passed on to the DATA OUT line prior to the next synchronizing CLK pulse.

By appropriately selecting the look-ahead period of the LAPP pulse, this look-ahead window can be controlled to avoid propagation delays associated with the flip-flop while maintaining synchronism with the internal CLK. By bypassing the flip-flop, the synchronized pulsed look-ahead technique can effect look-ahead operations for both HI and LO DATA phases.

Figure 2:
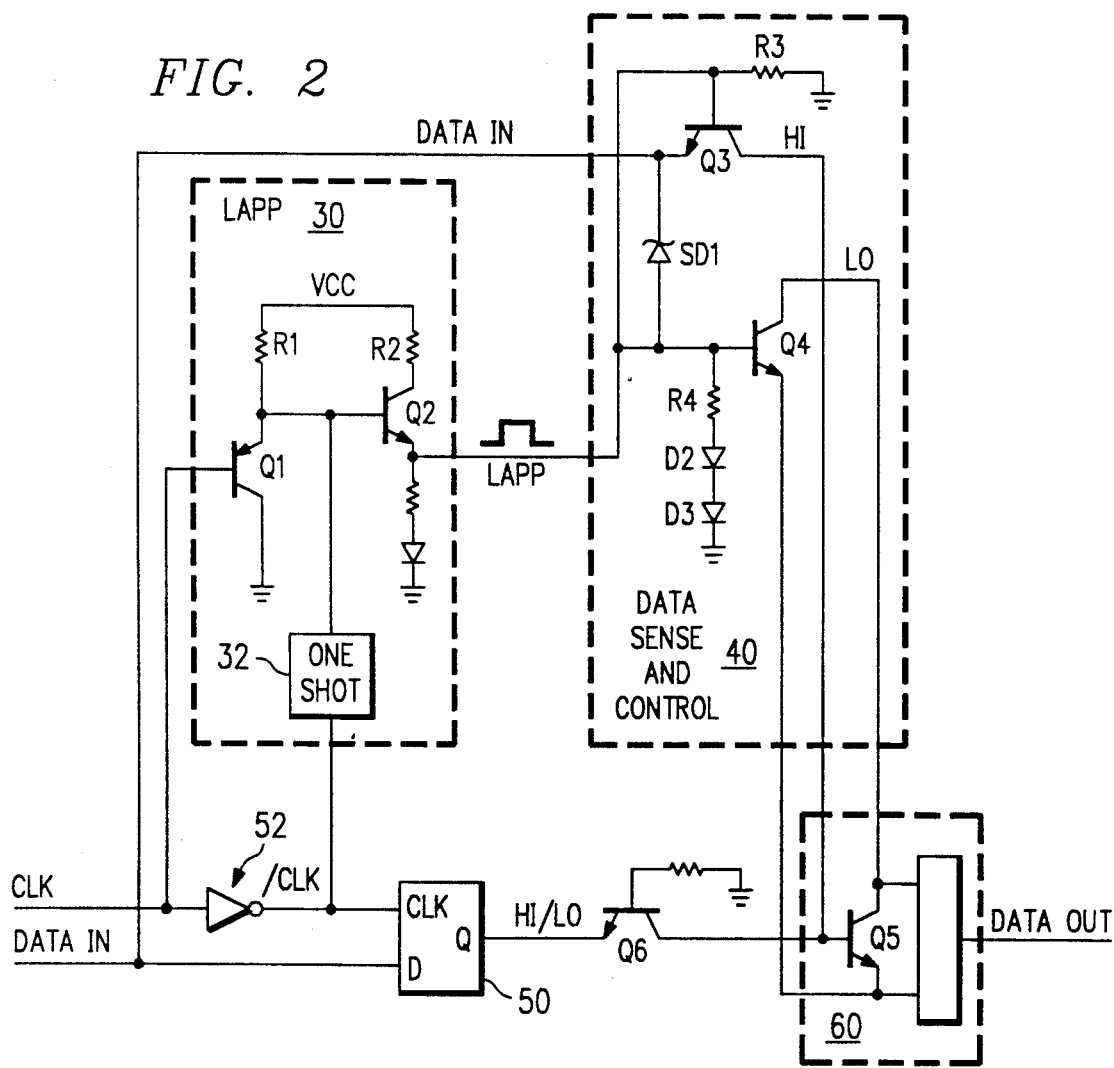
FIG. 2 is a schematic of an exemplary synchronized pulsed look-ahead circuit, including a LAPP section for providing a synchronized LAPP pulse, and a DATA sense and control section for performing synchronized pulsed look-ahead operations.

2. Synchronized Pulsed Look-Ahead Circuit. FIG. 2 is a simplified schematic of an exemplary implementation of a synchronized pulsed look-ahead circuit, comprising LAPP section 30 and DATA sense and control section 40. The synchronized pulsed look-ahead circuit performs look-ahead operations in conjunction with a flip-flop 50 and its associated DATA output driver 60.

In accordance with conventional logic design, for the exemplary synchronized pulsed look-ahead circuit, an inverter 52 is included on the CLK line to convert external rising-edge timing into the internal falling-edge timing typically used by flip-flops. That is, CLK pulses with a rising leading edge are inverted to provide /CLK pulses with a falling leading edge.

2.1. LAPP Section. LAPP section 30 includes a PNP transistor Q1, an NPN transistor Q2, and a one-shot timer 32. The CLK signal is input to the base of Q1, and the LAPP pulse is output from the emitter of Q2. The /CLK signal is also input to the one-shot timer 32.

Prior to initiating a look-ahead operation, i.e., with CLK low and /CLK high, PNP transistor Q1 is on, which holds Q2 off. With Q2 off, the LAPP line is inactive.

In response to the rising edge of a CLK pulse, Q1 turns off, which turns on Q2, switching the LAPP line active and initiating a LAPP pulse. Thus, the LAPP pulse is synchronized to CLK, and therefore to /CLK which synchronizes the flip-flop 50.

After a gate delay of about 2 ns, the CLK pulse rising edge appears as a /CLK falling edge at the output of inverter 52. /CLK is input both to the flip-flop 50 and to the one-shot timer 32.

One-shot timer 32 uses conventional one-shot timing techniques to provide a one-shot pulse output with a predetermined delay after being triggered by /CLK. The one-shot pulse output from one-shot timer 32 turns off Q2.

When Q2 is turned off by the one-shot timer pulse, the LAPP line is switched inactive, terminating the LAPP pulse. Thus, for the exemplary synchronized pulsed look-ahead circuit, the predetermined delay introduced by one-shot timer 32 also determines the look-ahead period of the LAPP pulse—the duration of this look-ahead period can be designated as a hold time Th. As discussed above, this hold time Th should be selected such that the look-ahead period for the LAPP pulse is at least as long as the propagation delay associated with the flip-flop latching operation.

For the exemplary LAPP section, the one-shot timer is implemented using a flip-flop. This approach ensures that the look-ahead period of the LAPP pulse is substantially equal to the propagation delay associated with the latching operation of flip-flop 50, thereby ensuring that the LAPP pulse remains active, and the DATA sense and control section of the synchronized pulsed look-ahead circuit remains enabled, until after the flip-flop latches DATA IN and assumes control of the DATA OUT line. That is, both the one-shot timer 32 and the flip-flop 50 are triggered by /CLK (about 2 ns after CLK initiates the LAPP pulse), so that the one-shot flip-flop toggles at about the same time that flip-flop 50 latches DATA IN, typically 4 ns after the /CLK pulse.

After the generation of the LAPP pulse, the falling trailing edge of CLK arrives at the base of PNP transistor Q1 and the inverter 52. Q1 turns on, holding Q2 off. After the 2 ns gate delay of the inverter, the rising trailing edge of /CLK toggles the one-shot flip-flop timer 32 in preparation for the next CLK pulse.

2.2. DATA Sense and Control Section. DATA sense and control section 40 includes NPN transistors Q3 and Q4. Q3 is biased by resistor R3, while Q4 is biased by resistor R4 and diodes D1 and D2.

The LAPP line is coupled to the base of Q3 and through Schottky diode SD1 to the emitter of Q3, and to the base of Q4. The DATA IN line is coupled to the emitter of Q3 and through the Schottky diode to the base of Q4.

Prior to initiating a look-ahead operation, i.e., with the LAPP line inactive, both Q3 and Q4 are off, and the DATA sense and control section 40 is disabled. In particular, the DATA IN input to the DATA sense and control section is not passed on to the DATA output driver 60, which is controlled by the flip-flop 50.

A LAPP pulse on the LAPP line enables the DATA sense and control section, which senses the HI/LO phase of DATA IN and correspondingly controls the DATA output driver. If DATA IN is LO—a LO-phase look-ahead—then Q3 turns on (Q4 remains off) and pulls Q5 in the DATA output driver off, so that DATA OUT is LO. If DATA IN is HI—a HI-phase look-ahead—then Q4 turns on (Q3 remains off) and pulls Q5 in the DATA output driver off, so that DATA OUT is HI. Thus, when enabled by a LAPP pulse, the DATA sense and control section senses the HI/LO phase of DATA IN, and provides the appropriated logic levels for controlling the DATA output driver, and therefore the DATA OUT line.

The bias networks for Q3 (R3) and Q4 (R4/D2/D3) determine how fast these transistors respond to a LAPP pulse by sensing DATA IN and turning on Q5, and therefore, how fast the DATA sense and control section assumes control over the DATA output driver (i.e., the DATA OUT line). Thus, for the exemplary synchronized pulsed look-ahead circuit, the response time established by these bias networks also determines the time after the receipt of a CLK pulse (i.e., LAPP line active) that the DATA sense and control section assumes control over the DATA output driver —the duration of the response time can be designated a control set-up time Tsu. This set-up time Tsu can be selected by appropriately configuring the set-up bias networks for Q3 and Q4.

DATA sense and control section 40 controls the DATA output driver and the DATA OUT line while enabled by a LAPP pulse. When the LAPP line switches inactive, both Q3 and Q4 are switched off, disenabling the DATA sense and control section.

With the DATA sense and control section disenabled, the transistor Q5 in the DATA output driver 60 is controlled by the flip-flop 50 through an interface transistor Q6 coupled to the base of Q5.

2.3. Optimizing Set-Up and Hold Times. Look-ahead operations performed by the exemplary synchronized pulsed look-ahead circuit can be customized for particular applications or operating environments by appropriately selecting the set-up time Tsu and the hold time Th. These parameters respectively determine how fast and how long the synchronized pulsed look-ahead circuit assumes control over the DATA OUT line.

For example, these parameters can be used to customize the design of the synchronized pulsed look-ahead circuit for optimum metastability performance. That is, it is possible for flip-flops and other synchronized devices to assume an intermediate, metastable condition that is neither HI nor LO. The flip-flop quickly transitions out of this intermediate metastable condition into either the HI or LO state, although the final state is unpredictable.

By appropriately selecting Th and in particular Tsu, metastability performance can be optimized.

3. Conclusion. Although the invention has been described with respect to a specific, exemplary embodiment, various changes and modifications may be suggested to one skilled in the art. For example, while the exemplary synchronized pulsed look-ahead circuit and method is used to implement look-ahead operations for both the HI and LO DATA phases, a single phase look-ahead could be performed. Also, some trade-off can be made between reducing propagation delay and reducing power consumption.

It is intended that the invention encompass any such changes and modifications as fall within the scope of the appended claims.

What is claimed is:

1. A synchronized pulsed look-ahead circuit for a synchronized device that, in synchronism with CONTROL signals, responds to multi-phase DATA inputs and provides corresponding DATA outputs after an associated propagation delay, comprising:
   a LAPP section for generating a synchronized LAPP pulse that switches active in synchronism with the CONTROL signal and is then switched inactive after a look-ahead period of a predetermined hold time Th; and
   a DATA sense and control section enabled by LAPP pulses and responsive to at least one DATA input phase for independently controlling, during the associated look-ahead periods, the DATA output of the synchronized device such that the corresponding DATA output phase is provided after a predetermined set-up time Tsu which is less than the associated propagation delay for the synchronized device;
   the duration of the hold time Th of the LAPP pulse being at least as long as the propagation delay.

2. The synchronized pulsed look-ahead circuit of claim 1, wherein the synchronized device is a storage device having two input/output phases designated HI and LO.

3. The synchronized pulsed look-ahead circuit of claim 2, wherein said look-ahead circuit is responsive to both the HI and LO phase of the DATA input.

4. The synchronized pulsed look-ahead circuit of claim 3, wherein the storage device is a flip-flop and each CONTROL signal is the leading edge of an internal clock pulse.

5. The synchronized pulsed look-ahead circuit of claim 1, wherein said LAPP section comprises:
   at least one LAPP initiation component responsive to a CONTROL signal for activating a LAPP pulse; and
   a timer component for selectively switching each LAPP pulse inactive after the predetermined hold time Th.

6. The synchronized pulsed look-ahead circuit of claim 5, wherein said LAPP initiation component comprises a transistor that is switched on by the CONTROL signal.

7. The synchronized pulsed look-ahead circuit of claim 5, wherein said timer component comprises a one-shot timer with a selectable period of Th.

8. The synchronized pulsed look-ahead circuit of claim 5, wherein the CONTROL signal is the leading edge of an internal clock.

9. The synchronized pulsed look-ahead circuit of claim 1, wherein said DATA sense and control section comprises:
   at least one DATA sense and control component responsive to a respective DATA input phase for providing a DATA output control signal to effect a DATA output of the appropriate phase; and
   a set-up network for establishing the predetermined set-up time Tsu for providing the DATA output control signal.

10. The synchronized pulsed look-ahead circuit of claim 9, wherein said DATA sense and control component comprises a transistor that is switched on by the LAPP pulse and a respective DATA input phase to provide the DATA output control signal, said transistor being biased by said set-up network.

11. The synchronized pulsed look-ahead circuit of claim 9, wherein the synchronized device is a storage device having two input/output phases designated HI and LO, and wherein said DATA sense and control section comprises:
   HI- and LO-phase DATA sense and control components each responsive to the LAPP pulse and to respective HI- and LO-phase DATA inputs for providing, after the predetermined set-up time Tsu, respective HI- and LO-phase DATA output control signals, such that the synchronized device effects respective HI- and LO-phase DATA outputs.

12. The synchronized pulsed look-ahead circuit of claim 9, wherein the storage device is a flip-flop and each CONTROL signal is the leading edge of an internal clock pulse.

13. The synchronized pulsed look-ahead circuit of claim 1, wherein the predetermined hold time Th for said LAPP section and the predetermined set-up time Tsu for the DATA sense and control section are cooperatively selected in accordance a with predetermined metastability performance for the synchronized device.

14. A synchronized pulsed look-ahead method circuit for a synchronized device that, in synchronism with CONTROL signals, responds to multi-phase DATA inputs and provides corresponding DATA outputs after an associated propagation delay, comprising the steps:
   generating a synchronized LAPP pulse that switches active in synchronism with the CONTROL signal and is then switched inactive after look-ahead period of a predetermined hold time Th which is at least as long as the propagation delay;
   in response to LAPP pulses and to at least one DATA input phase, independently controlling the DATA output of the synchronized device during the associated look-ahead periods such that the corresponding DATA output phase is provided after a predetermined set-up time Tsu which is less than the associated propagation delay for the synchronized device;
   returning control of the DATA output to the synchronized device at the end of the look-ahead period, when the propagation delay is over.

15. The synchronized pulsed look-ahead method of claim 14, wherein the synchronized device is a storage device having two input/output phases designated HI and LO, and wherein the step of controlling the data output comprises the step of, in response to LAPP pulses and the HI and LO DATA input phases, independently controlling, during the associated look-ahead periods, the DATA output of the synchronized device such that respective DATA output phases are provided after a time Tsu which is less than the associated propagation delay for the synchronized device.

16. The synchronized pulsed look-ahead circuit of claim 14, further comprising the step of cooperatively selecting the predetermined hold time Th and the predetermined set-up time in accordance with a predetermined metastability performance for the synchronized device.

17. A synchronized pulsed look-ahead circuit for a storage device that, in synchronism with a CONTROL signal, responds to HI- and LO-phase DATA inputs and provides corresponding HI- and LO-phase DATA outputs after an associated propagation delay, comprising:
 a LAPP section for generating a synchronized LAPP pulse that switches active in synchronism with the CONTROL signal and is then switched inactive after a look-ahead period of a predetermined hold time Th; and
 a DATA sense and control section enabled by LAPP pulses and responsive to respective HI- and LO-phase data inputs for independently controlling, during the associated look-ahead periods, the DATA output of the storage device such that the corresponding DATA output phase is provided after a predetermined set-up time Tsu which is less than the associated propagation delay for the synchronized device;
 the duration of the hold time Th of the LAPP pulse being at least as long as the propagation delay.

18. The synchronized pulsed look-ahead circuit of claim 17, wherein the storage device is a flip-flop and each CONTROL signal is the leading edge of an internal clock pulse.

19. The synchronized pulsed look-ahead circuit of claim 17, wherein said LAPP section comprises:
 a LAPP initiation component responsive to a CONTROL signal for activating a LAPP pulse; and
 a one-shot timer with a selectable period of Th.

20. The synchronized pulsed look-ahead circuit of claim 17, wherein said DATA sense and control section comprises:
 HI and LO sense and control components that are activated by the LAPP pulse and the respective HI- and LO-phase DATA inputs to provide respective DATA output control signals to effect the corresponding DATA output phase; and
 respective set-up networks for establishing the set-up time Tsu for each DATA output control signal.

21. The synchronized pulsed look-ahead circuit of claim 17, wherein the predetermined hold time Th for said LAPP section and the predetermined set-up time for said DATA sense and control section are cooperatively selected in accordance a with predetermined metastability performance for the synchronized device.

* * * * *